(12) United States Patent
Demkov et al.

(10) Patent No.: US 11,561,421 B2
(45) Date of Patent: Jan. 24, 2023

(54) SYSTEMS AND METHODS FOR INTEGRATING A-AXIS ORIENTED BARIUM TITANATE THIN FILMS ON SILICON (001) VIA STRAIN CONTROL

(71) Applicant: Board of Regents, The University of Texas System, Austin, TX (US)

(72) Inventors: Alexander A. Demkov, Austin, TX (US); Marc Reynaud, Austin, TX (US); Agham Posadas, Round Rock, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 288 days.

(21) Appl. No.: 16/912,316

(22) Filed: Jun. 25, 2020

(65) Prior Publication Data
US 2020/0409190 A1     Dec. 31, 2020

Related U.S. Application Data

(60) Provisional application No. 62/866,151, filed on Jun. 25, 2019.

(51) Int. Cl.
| | |
|---|---|
| *G02F 1/055* | (2006.01) |
| *C23C 16/455* | (2006.01) |
| *C30B 29/32* | (2006.01) |
| *C30B 23/02* | (2006.01) |
| *C23C 16/40* | (2006.01) |

(52) U.S. Cl.
CPC .......... *G02F 1/0551* (2013.01); *C23C 16/409* (2013.01); *C23C 16/45525* (2013.01); *C30B 23/025* (2013.01); *C30B 29/32* (2013.01)

(58) Field of Classification Search
CPC ....... H01L 28/55; H01L 28/56; C23C 16/409; C23C 16/45525; C04B 35/462; C30B 23/025; C30B 29/32; G02F 1/0551
See application file for complete search history.

(56) References Cited

U.S. PATENT DOCUMENTS

| | | | |
|---|---|---|---|
| 5,514,484 A * | 5/1996 | Nashimoto | C04B 35/462 117/948 |
| 2001/0015448 A1* | 8/2001 | Kawakubo | H01L 28/55 257/532 |
| 2003/0160329 A1* | 8/2003 | Lee | H01L 21/02266 257/E21.01 |

OTHER PUBLICATIONS

Lee et al., Transparent perovskite barium stannate with high electron mobility and thermal stability, Annual Review of Materials Research 47, 391 (Year: 2017).*

(Continued)

*Primary Examiner* — Brook Kebede

(57) ABSTRACT

Various embodiments of the present technology enable growth of a-axis oriented barium titanate (BTO) films by inserting a relaxed strain control layer having a larger lattice constant than the c-axis of BTO and a similar thermal expansion mismatch. As a result, in-plane tensile stress causes BTO to grow with its ferroelectric polarization in-plane. Some embodiments allow for BTO films to immediately be grown on silicon with a-axis orientation, and without the need to create thick layers for relaxation. Using various embodiments of the present technology, the BTO can be grown in-plane with minimal dislocation density that is confined to the interface region.

20 Claims, 9 Drawing Sheets
(1 of 9 Drawing Sheet(s) Filed in Color)

(56) References Cited

OTHER PUBLICATIONS

Hu, Shen et al., "Zintl Layer Formation During Perovskite Atomic Layer Deposition On Ge (001)," The Journal of Chemical Physics, vol. 146, pp. 052817-1-052817-10, 2017.
Upadhyay, Shail et al., "Preparation And Characterization Of Barium Stannate BaSnO3," Journal of Materials Science Letters, vol. 16, pp. 1330-1332, 1997.
Wikipedia, "Lithium Niobate," https://web.archive.org/web/20200618181321/https://en.wikipedia.org/wiki/Lithium_niobate, 4 pages, Apr. 1, 2020.

* cited by examiner

SYSTEMS AND METHODS FOR INTEGRATING A-AXIS ORIENTED BARIUM TITANATE THIN FILMS ON SILICON (001) VIA STRAIN CONTROL

RELATED APPLICATIONS

This application claims the benefit of and priority to U.S. Provisional Application No. 62/866,151, titled "Systems and Methods for Integrating A-Axis Oriented Barium Titanate Thin Films on Silicon (001) Via Strain Control," filed Jun. 25, 2019, which is incorporated herein in its entirety.

FEDERALLY FUNDED RESEARCH

This invention was made with government support under Grant no. FA9550-18-1-0053 awarded by the Air Force Office of Scientific Research. The government has certain rights in the invention.

TECHNICAL FIELD

Various embodiments of the present technology generally relate to silicon (Si)-based semiconductor manufacturing. More specifically, some embodiments of the present technology relate to systems and methods for integrating a-axis oriented barium titanate (e.g., $BaTiO_3$) thin films on silicon (001) via strain control.

BACKGROUND

Ferroelectric materials can be used in a variety of devices to provide a polarization that can be reoriented by the application of an electric field. A polarization that is entirely out-of-plane or in-plane is often desirable depending on the particular device or application. For example, electro-optic applications involving transmission of light through the thin film stack, as well as applications involving the transmission of light through waveguides made from either of a $BaTiO_3$ or an $Si/BaTiO_3$ heterostructure require that the ferroelectric polarization of $BaTiO_3$ be in the plane of the film. The ferroelectric polarization allows for the easy application of an electric field to the $BaTiO_3$ by simply patterning top electrodes without the need to create vias or trenches. One particular application is an electro-optic modulator.

In the absence of external stimuli such as stress or electric field, ferroelectric thin films are preferably polarized in the plane of the film as compared to being polarized normal to the surface. In the material $BaTiO_3$ ("BTO"), this is referred to as a-axis orientation, which is where the long crystal axis is laying flat parallel to the film surface. When grown on Si, which imposes a compressive in-plane strain, traditional techniques for growing a-axis oriented BTO on Si has usually involved growing at least ~100 nanometers (nm) of BTO for a sufficient portion of the film to become a-axis oriented. These known growth techniques are usually relatively slow and require substantial time to fabricate a-axis oriented BTO on Si heterostructures. As such, techniques are needed to maximize the volume fraction of the a-axis oriented films in order to speed up the fabrication process.

SUMMARY

Various embodiments of the present technology generally relate to semiconductor manufacturing. More specifically, some embodiments of the present technology relate to systems and methods for integrating a-axis oriented BTO thin films on Si (001) via strain control. Some embodiments provide for a heterostructure that includes an Si substrate, a strain control layer formed on the Si substrate, and a strained a-axis oriented BTO film formed on the strain control layer. In some embodiments, a buffer layer of strontium titanate ($SrTiO_3$) can be formed between the Si substrate and the strain control layer to assist in the growth. In other embodiments, the strained a-axis oriented BTO film can be immediately deposited with its long crystal axis parallel to the substrate flat (in-plane). In some embodiments, the strained a-axis oriented BTO film may be epitaxially grown with a ferroelectric polarization in-plane. The strained a-axis oriented BTO film may have a variable residual strain resulting from varying the thickness of the strain control layer.

In accordance with various embodiments, the strain control layer can include a relaxed layer of a perovskite, spinel, fluorite, rocksalt, or bixbyite oxide with appropriate lattice constant formed on the Si substrate. The perovskite, spinel, fluorite, rocksalt, or bixbyite oxide in some embodiments should have a larger (e.g., even just slightly, or nominally larger) lattice constant than the c-axis lattice parameter of BTO. As a result, the BTO thickness at which a-axis orientation occurs on Si can be substantially reduced as compared to traditional techniques. In some embodiments, 100% a-axis oriented domains can be grown if grown to ~100 nm thickness. In other embodiments, thinner (e.g., <40 nm) films with 100% a-axis orientation can also be grown on Si. By controlling the strain control layer, residual strain can also be imposed on the a-axis oriented BTO, which is known to enhance the ferroelectric and electro-optic properties of BTO. In accordance with various embodiments, various integrated optoelectronic devices may be formed on the strained a-axis oriented BTO.

While multiple embodiments are disclosed, still other embodiments of the present invention will become apparent to those skilled in the art from the following detailed description, which shows and describes illustrative embodiments of the technology. As will be realized, the technology is capable of modifications in various aspects, all without departing from the scope of the present invention. Accordingly, the drawings and detailed description are to be regarded as illustrative in nature and not restrictive.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the present technology will be described and explained through the use of the accompanying drawings.

Figure 1A:
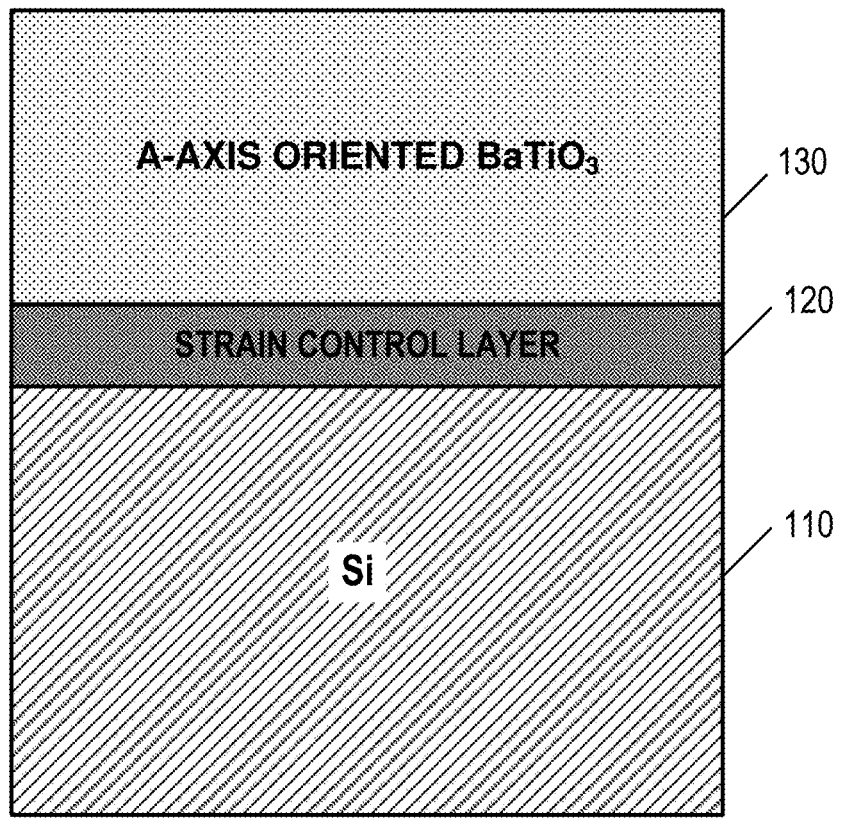
FIGS. 1A-1C illustrate examples of cross-sectional schematic diagrams of a heterostructure in accordance with some embodiments of the present technology.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology generally relate to semiconductor manufacturing. More specifically, some embodiments of the present technology relate to systems and methods for integrating a-axis oriented BTO (e.g., $BaTiO_3$) thin films on Si (001) via strain control. Traditionally, growing a-axis oriented BTO on Si has usually involved growing at least ~100 nm of BTO for a sufficient portion of the film to be a-axis oriented. In contrast, various embodiments of the present technology provide for techniques that can obtain an a-axis oriented film immediately, allowing substantial reduction in fabrication time. Furthermore, various embodiments of the present technology have the possibility of having a variable residual strain in the BTO film.

Various embodiments of the present technology provide techniques for creating strained a-axis oriented BTO films on Si for electro-optic and other applications requiring in-plane ferroelectric polarization (e.g., by using a stannate perovskite buffer layer). Electro-optic applications involving transmission of light through the thin film stack, as well as applications involving the transmission of light through waveguides made from either of a BTO or an Si/BTO heterostructure, require that the ferroelectric polarization of BTO be in the plane of the film. The ferroelectric polarization of BTO in the plane of the film allows for easy application of an electric field to the BTO by simply patterning top electrodes without the need to create vias or trenches.

Various embodiments of the present technology enable growth of a-axis oriented BTO films by inserting a relaxed strain control layer (e.g., a perovskite) that has a larger (e.g., even just slightly, or nominally larger) lattice constant than a lattice constant of a c-axis of BTO, and with very similar thermal expansion mismatch. Materials that have an in-plane lattice parameter of 0.1% larger than the c-axis lattice parameter of BTO would be sufficient to result in a-axis oriented growth. As a result, the excess in-plane tensile stress causes BTO to grow with its ferroelectric polarization in-plane (with respect to the BTO film, and likewise the Si substrate and the strain control layer) as well.

In order to prevent dislocation formation when the BTO is grown thicker, the strain control layer, in some embodiments, should ideally have a lattice constant no larger than 2.5% of the BTO c-axis lattice parameter. Some embodiments allow for BTO films to immediately be grown on Si with a-axis orientation, without the need to create very thick layers for relaxation. Using various embodiments of the present technology, the BTO can be grown in-plane with minimal dislocation density that is confined to the interface region.

While various embodiments have been described with respect to a-axis oriented BTO films, variations of these techniques can be applied to controlling strain states in other films grown on Si, especially those that have in-plane lattice constants larger than Si, for example, $PbTiO_3$ or $PbZr_xTi_{1-x}O_3$.

In the following description, for the purposes of explanation, numerous specific details are set forth in order to provide a thorough understanding of embodiments of the present technology. It will be apparent, however, to one skilled in the art that embodiments of the present technology may be practiced without some of these specific details.

The phrases "in some embodiments," "according to some embodiments," "in the embodiments shown," "in other embodiments," and the like generally mean the particular feature, structure, or characteristic following the phrase is included in at least one implementation of the present technology and may be included in more than one implementation. In addition, such phrases do not necessarily refer to the same embodiments or different embodiments.

FIG. 1A shows an example of a cross-sectional schematic diagram of a heterostructure (e.g., embodied in a wafer) in accordance with some embodiments of the present technology. As illustrated in the embodiments shown in FIG. 1A, the wafer includes a silicon substrate 110, a strain control layer 120 formed on the Si substrate, and a strained a-axis oriented barium titanate (BaTiO_3) film 130 formed on the strain control layer 120. In some embodiments, a buffer layer of strontium titanate ($SrTiO_3$) (not shown in FIG. 1A) can be formed between the Si substrate 110 and the strain control layer 120 to assist, or facilitate, formation, or growth, of the strained a-axis oriented BTO film 130, as described herein. In other embodiments, the strained a-axis oriented BTO film 130 can be immediately deposited with its long crystal axis parallel to the substrate flat (in-plane). The strained a-axis oriented BTO film 130 may be epitaxially grown with a ferroelectric polarization in-plane in some embodiments. The strained a-axis oriented BTO film 130 may have a variable residual strain resulting from varying the thickness of the strain control layer 120.

In accordance with various embodiments, the strain control layer 120 can include a relaxed layer (not shown in FIG. 1A) of a perovskite, spinel, fluorite, rocksalt, or bixbyite oxide formed on the silicon substrate. In accordance with various embodiments, the perovskite, spinel, fluorite, rocksalt, or bixbyite oxide should have a larger lattice constant than the c-axis of BTO. Examples of such materials include $SrZrO_3$ (a=4.095 Å), $SrHfO_3$ (a=4.090 Å), $BaSnO_3$ (a=4.115 Å), $MgAl_2O_4$ (a=4.043 Å), and $Co_3O_4$ (a=4.040 Å).

The BTO thickness at which a-axis orientation occurs can be substantially reduced as compared to traditional techniques. In some embodiments, a 100% a-axis oriented domains can be grown if grown to ~100 nm thickness. Thinner (e.g., <40 nm) BTO films with 100% a-axis orientation can also be grown on Si in other embodiments. By controlling the strain control layer 120, residual strain can also be imposed on the BTO, which is known to enhance the ferroelectric and electro-optic properties of BTO. In accordance with various embodiments, various integrated optoelectronic devices may be formed on the strained a-axis oriented BTO film 130 formed according to the present technology.

In some embodiments, the strain control layer 120, which may be a stannate-based perovskite, for example, can be easily doped with electrons, which may, provided careful control of growth conditions for the strain control layer 120, provide corresponding control over light absorption.

Figure 1B:
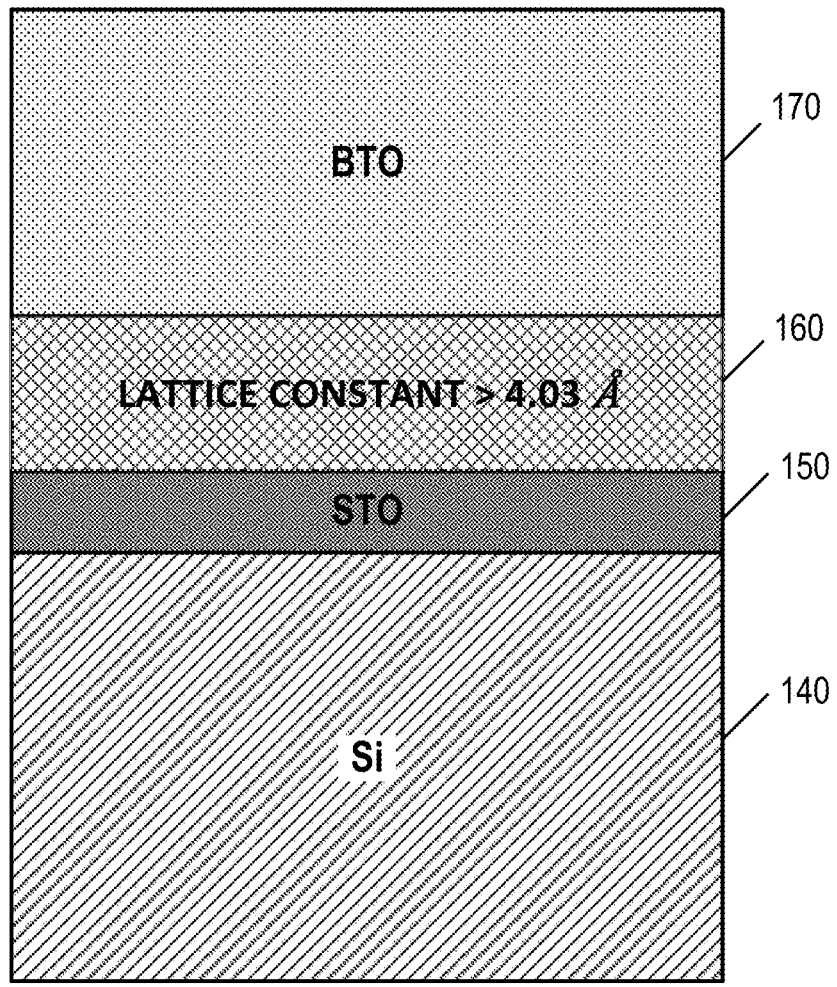
Figure 1C:
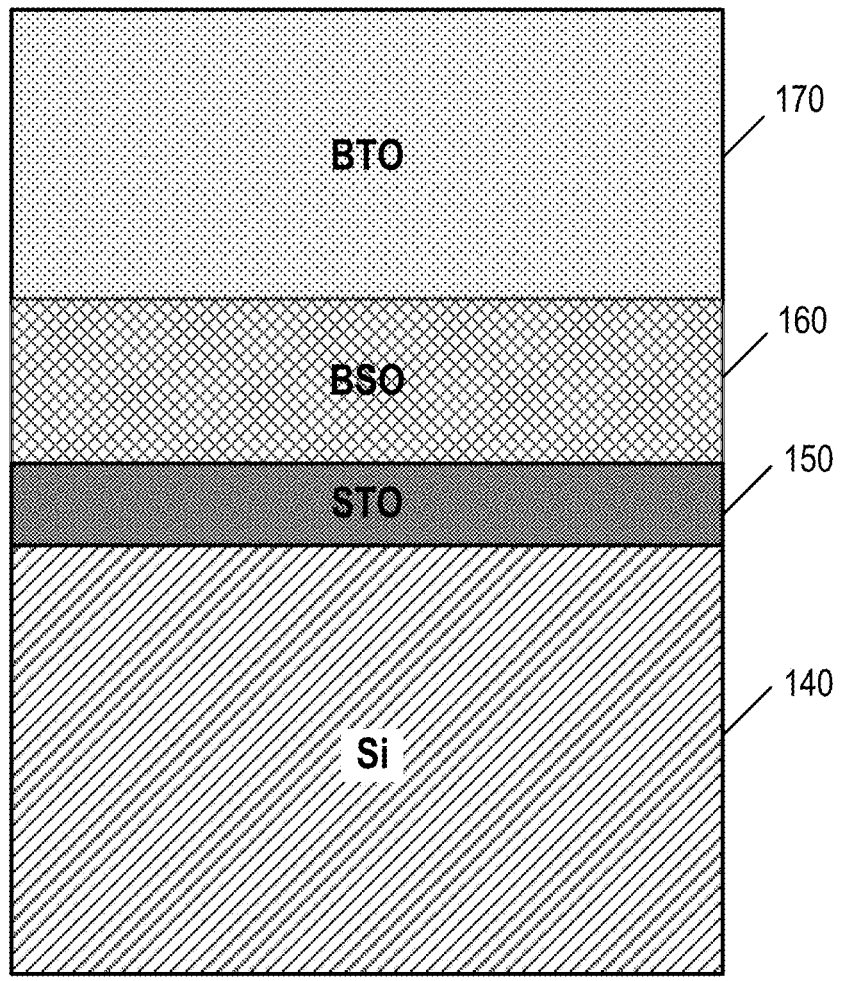

FIG. 1B illustrates an example of a cross-sectional schematic diagram of a heterostructure that may be created in accordance with various embodiments of the present technology. The heterostructure includes an Si substrate 140, a layer of $SrTiO_3$ ("STO") 150 followed by a layer 160 with a lattice constant greater than 4.03 Angstroms (Å) (e.g., a layer of barium stannate ($BaSnO_3$) as shown in FIG. 1C). A BTO layer 170 can then be grown on top of layer 160, as shown in FIG. 1B. In accordance with various embodiments, it is desirable for the layer 160 to be relaxed, so the layer of $SrTiO_3$ 150 has a large compressive strain on it (e.g., as compared to heterostructures prepared according to known methods). As a result, the BTO layer 170 grows correctly as a cubic structure and is not affected by the lattice constant of STO—that is, the BTO layer 170 desirably grows at the lattice constant of the $BaSnO_3$ ("BSO") layer 160.

FIG. 1C illustrates an example of a cross-sectional schematic diagram of a heterostructure in accordance with some embodiments of the present technology. The heterostructure illustrated in FIG. 1C has been fabricated. The heterostructure includes an Si substrate 140, a layer of STO 150 followed by a layer of BSO 160. A BTO layer 170 was then grown on top of the BSO layer 160, as shown in FIG. 1C. In accordance with various embodiments, it is desirable for the layer of BSO 160 to be relaxed, so the layer of STO 150 has a large compressive strain on it (e.g., as compared to heterostructures prepared according to known methods). As a result, the layer of BTO 170 grows correctly as a cubic structure and is not affected by the lattice constant of STO—that is, the BTO layer 170 desirably grows at the lattice constant of the BSO layer 160.

Typically, when there is a lattice mismatch, the material which is being grown follows the lattice parameter of the layer upon which it is grown, and the strain is built up in the film being grown as the layers grow thicker and thicker. At some point, the energy of the elastic strain becomes larger than the energy to create a dislocation and a relaxation occurs. As compared to known processes, various embodiments of the present technology take advantage of the large strain (e.g., as compared to heterostructures prepared according to known methods) from the very beginning, thereby allowing immediate relaxed epitaxial growth.

Figure 2:
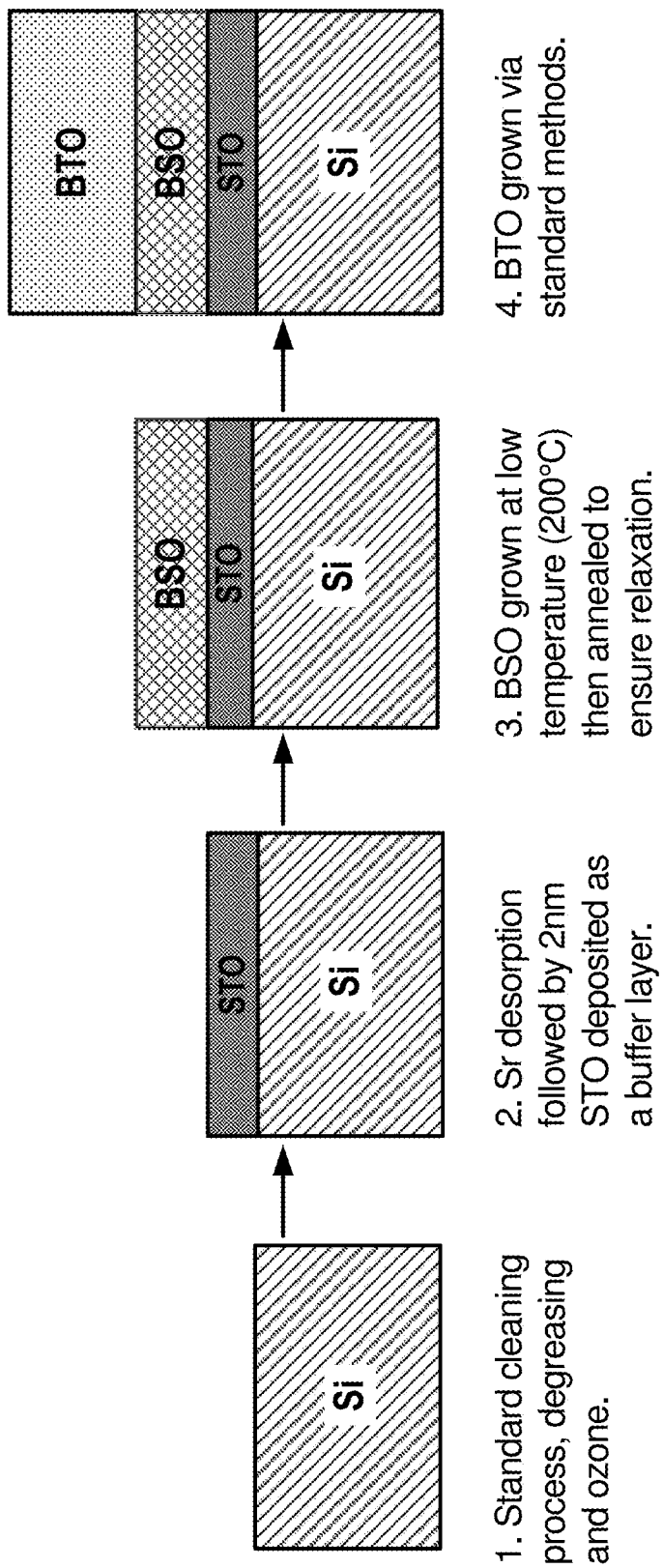
FIG. 2 illustrates an example of the steps for creating a heterostructure as shown in FIG. 1C in accordance with some embodiments of the present technology.

FIG. 2 illustrates an example of steps for creating a heterostructure as shown in FIG. 1C. As illustrated in FIG. 2, the Si substrate (e.g., Si substrate 140) can be cleaned of contaminants (e.g., using standard cleaning processes, degreasing techniques, and ozone). Strontium-assisted oxide desorption can be utilized followed by deposition of a seed layer (e.g., 2 nm) of STO to create a buffer layer (e.g., STO layer 150). The layer of BSO (e.g., BSO layer 160) can then be grown at a low temperature (e.g., 200° C. or less than 300° C.) then annealed to ensure relaxation. Finally, the layer of BTO (e.g., BTO layer 170) can be grown on the relaxed BSO layer (e.g., BSO layer 160) via standard methods.

Figure 3A:
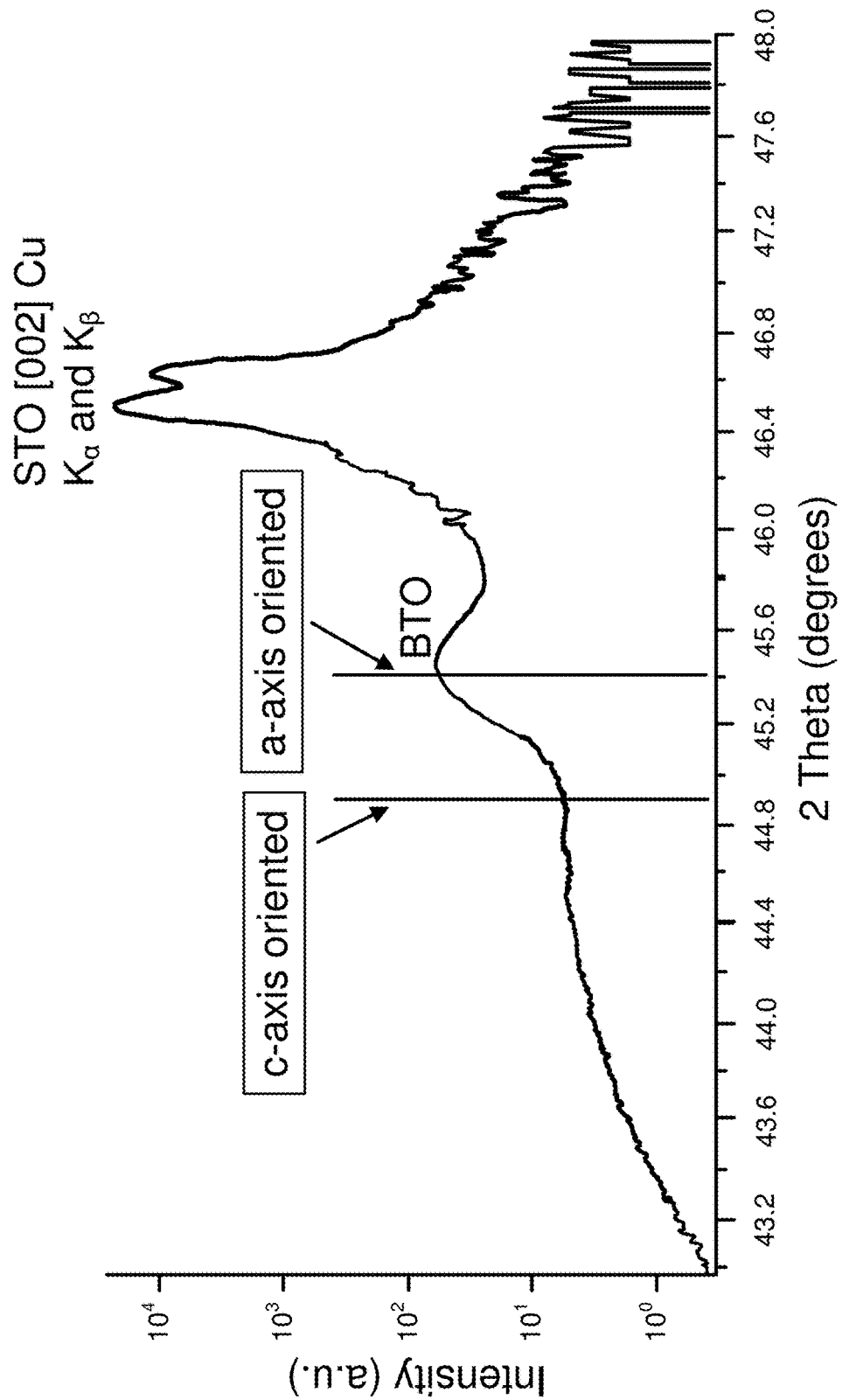
FIG. 3A shows the out of plane x-ray diffraction θ-2θ scan of a heterostructure as illustrated in FIG. 1C.
Figure 3B:
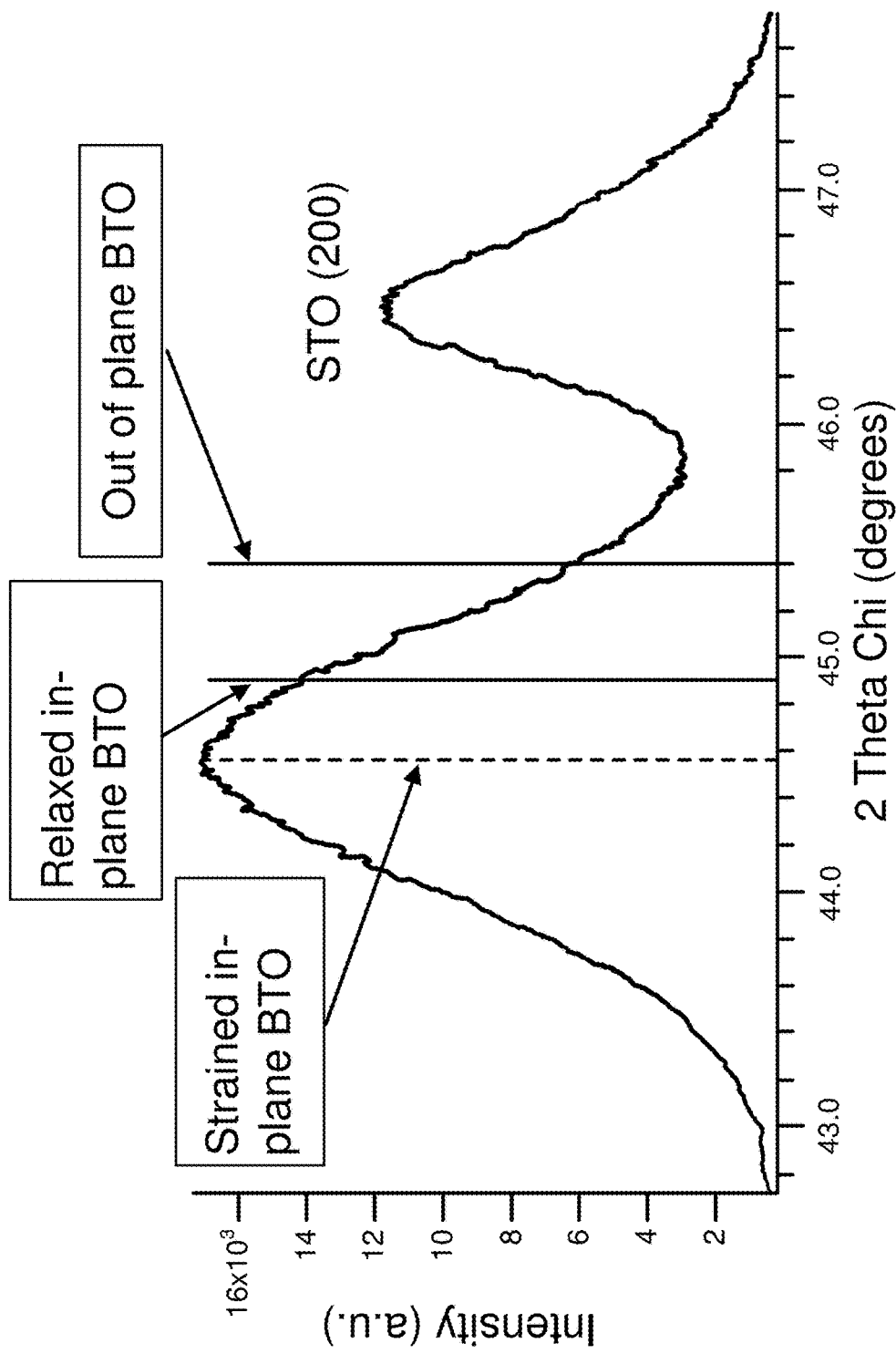
FIG. 3B shows the in-plane x-ray diffraction scan of a heterostructure as illustrated in FIG. 1C.
Figure 3C:
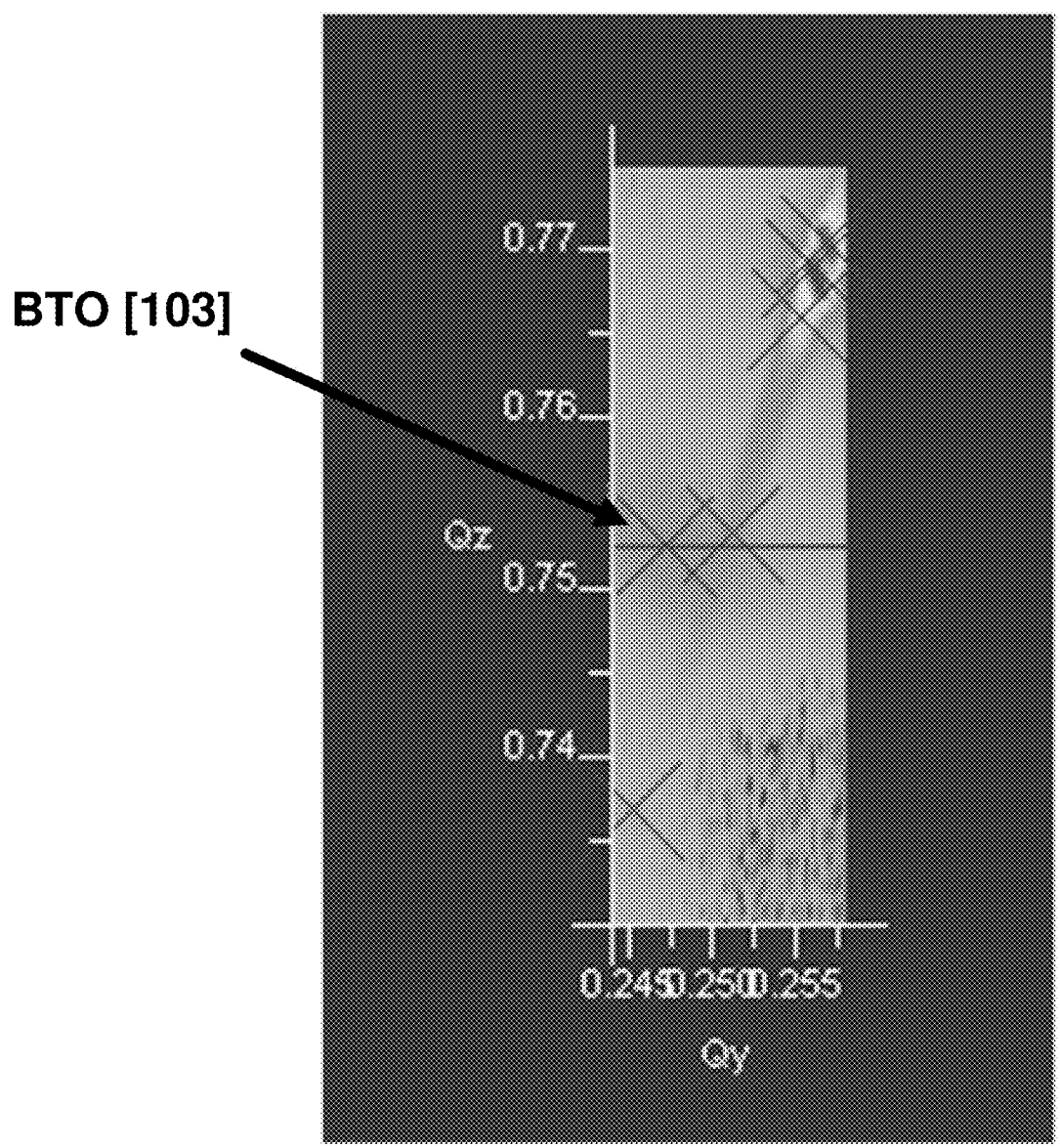
FIG. 3C is a reciprocal space map of a heterostructure as illustrated in FIG. 1C.

FIG. 3A shows the out of plane x-ray diffraction θ-2θ scan of a heterostructure as illustrated in FIG. 1C. The peak at around 45.5 degrees corresponds to an out of plane lattice constant of 3.98 Å, which confirms that the layer of BTO (e.g., BTO layer 170) was successfully grown with a-axis orientation. FIG. 3B shows the in-plane x-ray diffraction scan of a heterostructure as illustrated in FIG. 1C and confirms that the BTO c-axis lies in the plane of the film. FIG. 3C is a reciprocal space map of a heterostructure as illustrated in FIG. 1C. The reciprocal space map verifies that the BTO film (e.g., BTO layer 170) is a-axis oriented with a residual strain of 0.4 and mechanically decoupled from the STO (e.g., STO layer 150).

Figure 4:
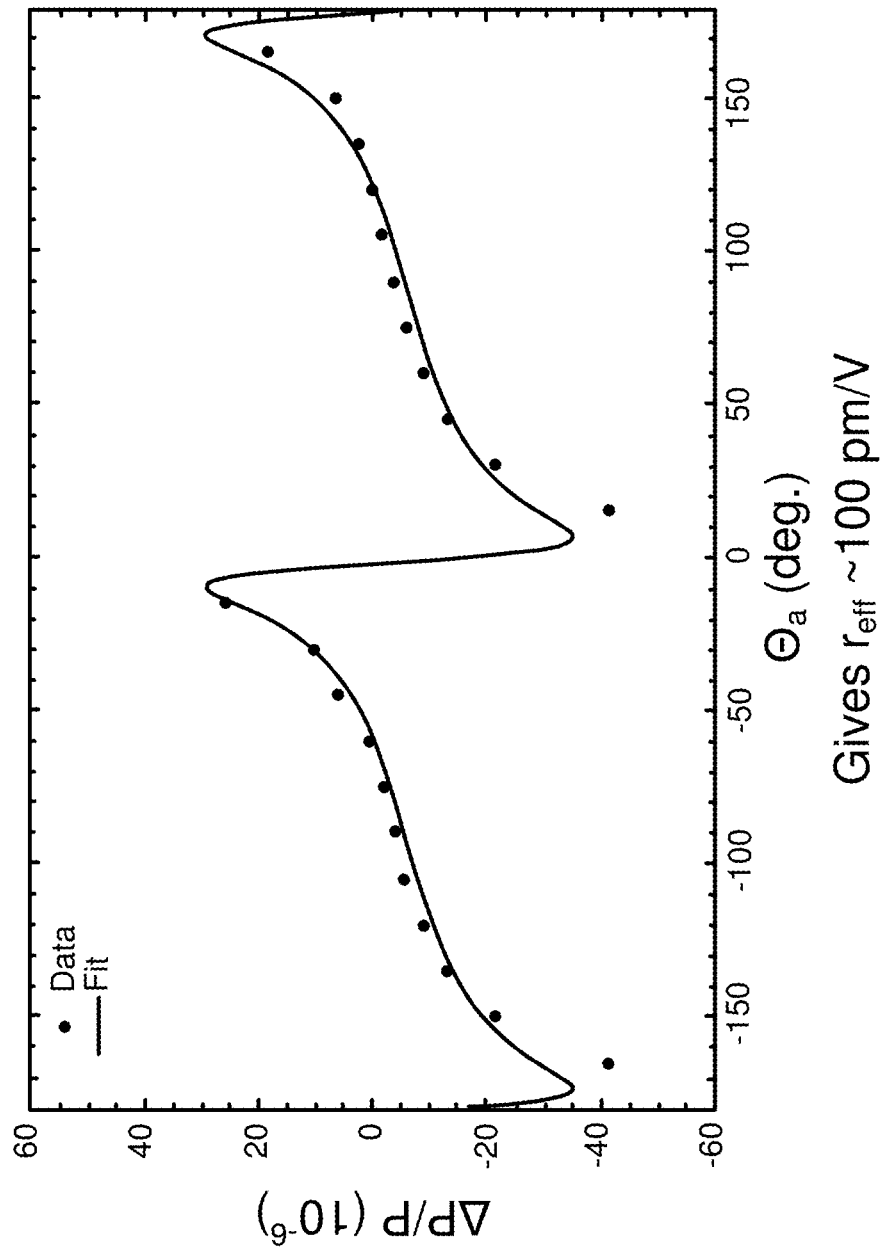
FIG. 4 shows a plot of the relative change in polarization of light transmitted through the heterostructure and the theoretical response confirming the linear electro-optical effect in the heterostructure.

FIG. 4 shows a plot of the relative change in the polarization light transmitted through the heterostructure and the theoretical response for an electro-optic material grown as illustrated in FIG. 1C. This shows that the very thin BTO film (e.g., BTO layer 170 having a thickness of ~40 nm) created using various embodiments of the present technology provides an electro-optic response (Pockels coefficient) of $r_{\it{eff}}$~100 pm/V. This value is already significantly larger as compared to known commercial devices (e.g., lithium niobate wafers have ~36 pm/V). The sample produced in accordance with various embodiments of the present technology can already produce a response ~3 times that of currently known commercial devices.

In FIG. 4, the relative change in the polarization light transmitted through the heterostructure is plotted as ΔP/P on the y-axis, with θ on the x-axis of the plot. In the expression ΔP/P, P is the power measured by a detector at the end of an electro-optic setup. The light's polarization is set and then modulated by applying a direct current (DC) electric field to the film (e.g., the ~40 nm BTO film 170), and is then relinearized with a rotation via a quarter wave plate. The light passes through an analyzer that follows a Malus's law ($P=P_o \sin^2 (\theta-\varphi)$+Background) response upon hitting the detector, with θ being the angle between the input polarization and the outgoing polarizer, and φ being the modulation of the light due to the Pockels effect and any misalignments. However, the modulation of light in thin films is small due to the small optical path length in the film (e.g., as compared to non-thin films). So, an alternating current (AC) field is also applied and the response is further modulated. This AC modulation can be measured with a lock-in amplifier, where this measured value corresponds to ΔP. Then ΔP/P is plotted, as shown in FIG. 4, with the illustrated data points and the fit curve taking the form:

$$\frac{\Delta P}{P} = \frac{\left( \delta \frac{\partial P}{\partial \theta} + \tau \frac{\partial P}{\partial P_0} \right)}{P}. \tag{1}$$

From Equation (1), δ is extracted and is the AC modulated phase shift. This can be used to find a value for the Pockels coefficient of the film (e.g., BTO film 170).

Figure 5:
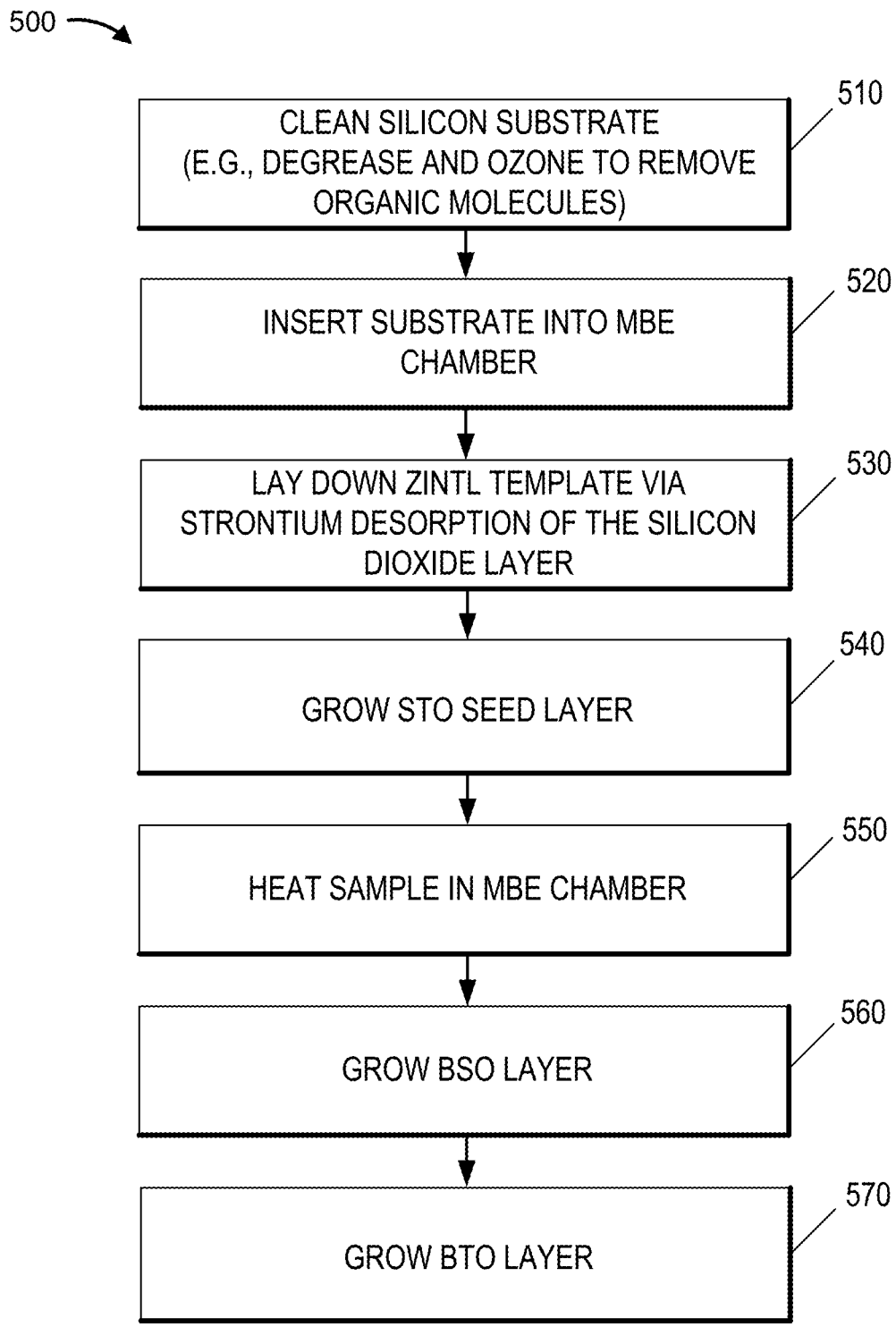
FIG. 5 is a flowchart illustrating a set of operations for manufacturing a-axis oriented BTO in accordance with some embodiments of the present technology.

FIG. 5 is a flowchart illustrating a set of operations 500 for manufacturing a-axis oriented BTO (e.g., BTO layer 170) in accordance with some embodiments of the present technology. As illustrated in the embodiments shown in FIG. 5, a cleaning operation 510 can be used to clean the Si substrate (e.g., Si substrate 140) by removing any chemical or particle contaminants (e.g., oils, organic contaminants, etc.). Cleaning operation 510 can include, but is not limited to, various solvent cleanings (e.g., acetone and methanol), RCA-1 cleaning, hydrofluoric acid dip, ozone cleaning, and/or other degreasing and cleaning techniques of the silicon substrate.

An insertion operation 520 can insert the substrate into a molecular-beam epitaxy (MBE) chamber. During a Zintl template operation 530, a Zintl template can be formed via strontium-assisted desorption of a silicon dioxide (SiO$_2$) layer present on the Si substrate. The Zintl template layer on Si additionally strongly suppresses SiO$_2$ formation during the initial perovskite oxide nucleation process, while simultaneously lowering the interface energy. The presence of this Zintl template formed by half monolayer (ML) Sr coverage allows for direct epitaxy of a perovskite on Si. A growth operation 540 can grow an STO seed layer (e.g., STO layer 150 having a thickness of 2 nm) at below 300° C. (e.g., 200° C.). The sample temperature can then be increased during a heating operation 550 to approximately 500-650° C. to crystallize the STO seed layer.

A BSO growth operation 560 can grow a BSO layer (e.g., BSO layer 160 having a thickness of 7 nm). In BSO growth operation 560, the BSO film layer can be grown at 200° C. then annealed to crystallize. BSO's lattice constant is 4.11-4.12 Å (see, e.g., Upadhyay, et al. "Preparation and characterization of barium stannate BaSnO3." *Journal of materials science letters* 16.16 (1997): 1330-1332, which is hereby incorporated by reference in its entirety for all purposes). However, the lattice constant is about 2% larger than the BTO c-axis lattice constant, 4.03 Å. As a result, growing BTO (e.g., BTO layer 170) on the BSO layer facilitates yielding in-plane (a-axis oriented) BTO for the resulting heterostructure produced according to the present technology. This further facilitates ensuring that the BSO is not strained to the STO, but is fully relaxed. One growth technique that ensures relaxed BSO with regards to an underlying STO layer is atomic layer deposition (ALD).

After completion of the BSO growth operation 560, standard BTO growth methods can be used during a BTO growth operation 570 to grow the BTO layer (e.g., BTO layer 170). For example, in some embodiments, a 2 nm BTO seed layer can be deposited at 600-650° C., with a total oxygen pressure of $5\times10^{-7}$ torr in the MBE chamber. Then, the rest of the BTO can be grown at approximately 700-750° C. with a total oxygen pressure of $5\times10^{-6}$ torr in the MBE chamber. The BTO and BSO will clamp to each other and the BSO will shrink while the BTO will expand, causing in-plane strain which leads to a-axis oriented BTO. Having thicker BSO layers can facilitate formation (e.g., growth) of a more strained BTO film. The embodiments illustrated in FIG. 5 have been verified to start immediately growing strained a-axis oriented BTO on BSO/STO/Si without relaxation.

Electro-Optic Applications

Electro-optic applications involving transmission of light through the thin film stack, as well as applications involving the electrical modulation of light in waveguides made from either of a BTO or a Si/BTO heterostructure may require that the ferroelectric polarization of BTO be in the plane of the film. This orientation of BTO allows for a simplified electrode pattern for electro-optic modulation.

Electro-optic modulators allow for the application of an electric field to modulate the amplitude and phase of light. The electro-optic modulators can be used in electro-optical transducers, where the signal is sent via the optical domain, but the actuator uses electrical signal. There are different ways of building electro-optic modulators. The Pockels effect offers extremely fast low power modulators that can be integrated onto Si(001) and thus can also be used in Si photonics. Such electro-optic modulators can be applied in quantum computing and optical computing (e.g., with photonic neural networks).

Quantum Computing: On-chip quantum interference is at the heart of quantum photonics circuits to ensure single photon operation or to build logic gates. Various embodiments of the present technology can be used to build such devices and also beam splitters, including multiport ones. Currently LiNbO$_3$ (LBN)-based devices have been proposed for the 1550-nm operation (M. He et al., https://doi.org/10.1038/s41566-019-0378-6; Vol. 26, No. 2|22 Jan. 2018|OPTICS EXPRESS 1547, which is hereby incorporated by reference in its entirety for all purposes). BTO is by far superior to LBN (S. Abel et al., https://doi.org/10.1038/s41563-018-0208-0, Vol. 18, pp. 42-47|12 Nov. 2019|NATURE MATERIALS, which is hereby incorporated by reference in its entirety for all purposes).

Photonic neural networks: photonic-based Neural Network (NN) designs may enable high throughput and low power neuromorphic compute paradigms since they bypass the parasitic charging of capacitive wires. Electro optic modulators are essential components of such NN designs. Pockels effect-based modulators incorporating aspects of the present technology offer high, speed low power room temperature solutions.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "on," "connected," or "coupled" means having any attachment, connection or coupling, either direct or indirect, between two or more elements; the attachment, coupling. or connection between the elements can be physical, logical, or a combination thereof. Similarly, the phrase "directly on" means a direct attachment, connection, or coupling without any intermediate elements, layers, etc. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, various aspects may be presented in other system claims, composition of matter claims, method claims, or in other forms, such as being embodied in a means-plus-function claim. Any claims intended to be treated under 35 U.S.C. § 112(f) will begin with the words "means for", but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A wafer comprising:
   a silicon substrate;
   a strain control layer formed on the silicon substrate; and
   a strained a-axis oriented barium titanate (BTO) film formed on the strain control layer,
   wherein a short, a-axis for BTO crystals in the film are normal to a plane defined by a surface of the silicon substrate in contact with the strain control layer, and
   wherein a long, c-axis for BTO crystals in the film are:
      parallel to the plane, and
      in a direction defined by a substrate flat of the silicon substrate.

2. The wafer of claim 1, further comprising a buffer layer of strontium titanate formed between the silicon substrate and the strain control layer.

3. The wafer of claim 1, wherein the BTO film is epitaxially grown on the strain control layer with a ferroelectric polarization in-plane with respect to the BTO film.

4. The wafer of claim 1, wherein residual strain of the strained a-axis oriented BTO film varies in proportion with a thickness of the strain control layer.

5. The wafer of claim 1, further comprising one or more integrated optoelectronic devices formed in or on the strained a-axis oriented BTO film.

6. The wafer of claim 1, wherein the strain control layer includes a relaxed layer formed on the silicon substrate, the relaxed layer formed of one of: a perovskite, a spinel, a fluorite, a rocksalt, and a bixbyite oxide.

7. The wafer of claim 6, wherein a lattice constant of the relaxed layer is larger than a lattice constant of the c-axis of BTO.

8. The wafer of claim 1, wherein the strain control layer includes a layer of barium stannate.

9. A wafer comprising:
   a substrate;
   a relaxed layer of barium stannate formed on the substrate; and
   a strained a-axis oriented barium titanate (BTO) film formed on the layer of barium stannate,
   wherein a short, a-axis for BTO crystals in the film are normal to a plane defined by a surface of the substrate in contact with the relaxed layer, and
   wherein a long, c-axis for BTO crystals in the film are:
      parallel to the plane, and
      in a direction defined by a substrate flat of the substrate.

10. A method comprising:
    forming a Zintl template on a silicon substrate;
    growing a seed layer of strontium titanate (STO) on the silicon substrate;
    growing a strain control layer on the seed layer; and
    growing a layer of a-axis oriented barium titanate (BTO) on the strain control layer.

11. The method of claim 10, wherein growing a seed layer of STO comprises: growing the seed layer of STO to a thickness of 2 nm at a temperature below 300° C., and then increasing the temperature to greater than or equal to 300° C. to facilitate crystallization of the seed layer of STO.

12. The method of claim 10, wherein growing a layer of a-axis oriented BTO comprises depositing the a-axis oriented BTO on the strain control layer with a long crystal axis of the a-axis oriented BTO in-plane with a substrate flat of the silicon substrate.

13. The method of claim 10, wherein growing a layer of a-axis oriented BTO comprises forming the layer of a-axis oriented BTO on the strain control layer in the absence of strain of the BTO to the STO.

14. The method of claim 10, wherein growing a layer of a-axis oriented BTO comprises depositing the a-axis oriented BTO on the strain control layer using one of: sputtering, pulsed laser deposition, chemical vapor deposition, and atomic layer deposition.

15. The method of claim 10 further comprising forming one or more integrated optoelectronic devices formed in or on the layer of a-axis oriented BTO.

16. The method of claim 10, wherein growing a layer of a-axis oriented BTO comprises epitaxially growing the layer of a-axis oriented BTO having a ferroelectric polarization in-plane with respect to the strain control layer.

17. The method of claim 10, wherein growing a strain control layer comprises growing the strain control layer with a layer of barium stannate.

18. The method of claim 10, wherein growing a strain control layer comprises growing the strain control layer with a relaxed layer formed on the silicon substrate.

19. The method of claim 18, wherein the relaxed layer is formed of one of: a perovskite, a spinel, a fluorite, a rocksalt, and a bixbyite oxide.

20. The method of claim 18, wherein a lattice constant of the relaxed layer is larger than a lattice constant of a c-axis of BTO.

* * * * *